(12) United States Patent
Chen et al.

(10) Patent No.: US 7,943,512 B2
(45) Date of Patent: May 17, 2011

(54) METHOD FOR FABRICATING METAL SILICIDE

(75) Inventors: Yi-Wei Chen, Taichung County (TW); Kuo-Chih Lai, Tainan (TW); Nien-Ting Ho, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 172 days.

(21) Appl. No.: 11/955,698

(22) Filed: Dec. 13, 2007

(65) Prior Publication Data
US 2009/0155999 A1 Jun. 18, 2009

(51) Int. Cl.
*H01L 21/44* (2006.01)

(52) U.S. Cl. .................. 438/664; 257/E21.211

(58) Field of Classification Search .......... 438/664; 257/E21.211
See application file for complete search history.

(56) References Cited

U.S. PATENT DOCUMENTS

| | | | | |
|---|---|---|---|---|
| 6,426,291 | B1* | 7/2002 | Hu et al. | 438/682 |
| 6,797,614 | B1* | 9/2004 | Paton et al. | 438/655 |
| 2002/0146904 | A1* | 10/2002 | Buynoski et al. | 438/682 |
| 2003/0082880 | A1* | 5/2003 | Yu et al. | 438/299 |
| 2003/0186022 | A1* | 10/2003 | Homma | 428/98 |
| 2005/0158996 | A1* | 7/2005 | Kim et al. | 438/664 |
| 2005/0176205 | A1* | 8/2005 | Chien et al. | 438/299 |
| 2006/0042651 | A1* | 3/2006 | Verhaverbeke et al. | 134/1 |
| 2006/0266737 | A1* | 11/2006 | Hanestad et al. | 216/96 |
| 2008/0106942 | A1* | 5/2008 | Kim et al. | 365/185.17 |
| 2009/0152600 | A1* | 6/2009 | Raghavan et al. | 257/288 |

* cited by examiner

*Primary Examiner* — Evan Pert
*Assistant Examiner* — Hajar Kolahdouzan
(74) *Attorney, Agent, or Firm* — WPAT, PC; Justin King

(57) ABSTRACT

A method for fabricating a metal silicide film is described. After providing a silicon material layer, a metal alloy layer is formed to cover the silicon material layer. A thermal process is performed to form a metal alloy silicide layer in a self-aligned way. A wet etching process is performed by using a cleaning solution including sulfuric acid and hydrogen peroxide to remove the residual metals and unreacted metal alloy.

14 Claims, 5 Drawing Sheets

METHOD FOR FABRICATING METAL SILICIDE

BACKGROUND OF THE INVENTION

1. Field of Invention

The present invention relates to a method for fabricating metal silicide. More particularly, the present invention relates to a method for fabricating a metal silicide film, which is capable of efficiently removing the unreacted metal alloy and residual metals.

2. Description of Related Art

Metal silicide thin films, used as ohmic contacts, Schottky barrier contacts, gate electrodes, local interconnects and diffusion barriers are commonly present in the semiconductor or microelectronics devices. For the semiconductor devices, as metal silicide has lower resistance and higher thermal stability, salicide (self-aligned silicide) technology is frequently applied to form a metal silicide layer on the surfaces of the gate and source/drain regions, in order to reduce the sheet resistance of the source/drain region and maintain the integrity of the shallow junction.

The most commonly used metal silicide materials include titanium silicide, tungsten silicide, cobalt silicide, nickel silicide, molybdenum silicide and platinum silicide. Among them, nickel-silicide (NiSi) is a promising silicide material due to its low formation temperature, low silicon consumption during silicidation and low contact resistance. However, one potential predicament for nickel-silicide is the nucleation of high resistive phase, particularly at high temperature. In order to solve the above problem, platinum (Pt) is added to the nickel-silicide and the resultant nickel-platinum (metal) silicide Ni(Pt)Si has shown enhanced functionality in sub-micron devices.

In general, a metal silicide layer is formed through the reaction of the metal with silicon at the interface between the metal layer and the gate or the source/drain regions by performing a thermal treatment toward the metal layer covering the gate electrode and/or the source/drain regions. In the process of fabricating the above metal silicide layer, the remained unreacted metal must be removed as the residual unreacted metal may negatively affect the electrical property of the device. However, take Ni—Pt metal silicide as an example, the residual platinum metal usually cannot be completely removed by using the conventional sulfuric acid-hydrogen peroxide mixture (SPM) cleaning solution or ammonium hydrogen peroxide mixture (APM) cleaning solution. As a result, extra cleaning steps or additional cleaning solutions are required for effectively removing the residual metals during the fabrication process of the metal silicide.

SUMMARY OF THE INVENTION

The present invention provides a method for fabricating a metal silicide layer, which method is capable of effectively removing the residual, unreacted metals.

The present invention relates to a method for fabricating a nickel platinum silicide thin film with good electrical properties, by efficiently removing the residual platinum.

The present invention provides a method for fabricating a metal silicide layer. First, a silicon material layer is provided. Then, a metal alloy layer is formed on the silicon material layer, and the metal alloy layer contains nickel and platinum. Then, a first rapid thermal process (RTP) is performed at a first temperature. Next, an etching or stripping process is performed by using a cleaning solution including sulfuric acid and hydrogen peroxide. Optionally, a second RTP can be performed with a second temperature, wherein the second temperature is higher than the first temperature.

According to the above method described in an embodiment of the present invention, the cleaning solution of the stripping process consists of a mixture of a sulfuric acid solution and a diluted hydrogen peroxide solution in a ratio ranging from about 3/1 to 4/5. For example, the sulfuric acid solution can be a 96% wt. $H_2SO_4$ solution and the diluted hydrogen peroxide solution can be a 35% wt. $H_2O_2$ solution.

According to the above method described in an embodiment of the present invention, water is co-applied with the cleaning solution during the etching process for the etching process using the cleaning solution with the mixing ratio of the sulfuric acid solution:the diluted hydrogen peroxide solution larger than 1:1 but smaller than 4:3 and larger than 2:1. In addition, the timing of introducing water can be fine-tuned depending on the process requirements.

According to the above method described in an embodiment of the present invention, a cap layer is further formed on the metal alloy layer after the metal alloy layer is formed and before the first rapid thermal process is performed.

In view of the above, the present invention uses the cleaning solution including sulfuric acid and hydrogen peroxide to strip off the unreacted metal alloy layer, so the residual platinum can be effectively removed and the metal silicide has a better electrical property.

In order to male the aforementioned and other objectives, features and advantages of the present invention comprehensible, preferred embodiments accompanied with figures are described in detail below.

BRIEF DESCRIPTION OF THE DRAWINGS

FIG. 3A is a schematic side view of the etch chamber for the stripping process, while

DESCRIPTION OF EMBODIMENTS

Figure 1A:
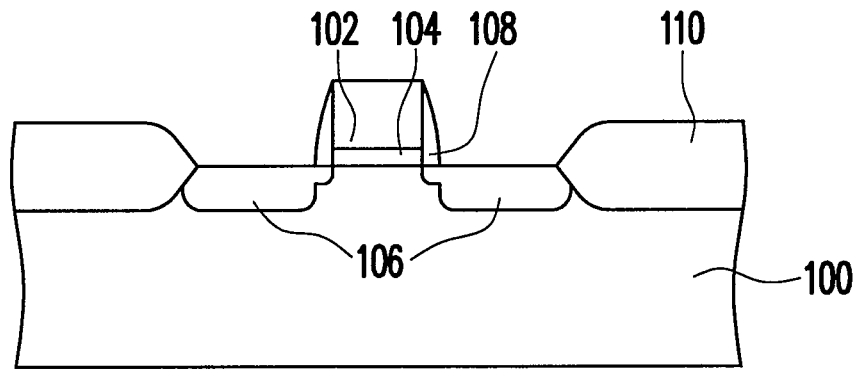
FIGS. 1A-1E are cross-sectional views showing steps of a method of fabricating a semiconductor device according to one preferred embodiment of the present invention.

FIGS. 1A-1E are cross-sectional views showing steps of a method of fabricating a semiconductor device having a metal silicide layer according to one preferred embodiment of the present invention. First, referring to FIG. 1A, a silicon substrate 100 is provided with isolation structures 110 formed in the silicon substrate 100 to define an active area. The isolation structures 110 can be, for example, a field oxide layer formed by LOCOS process or a shallow trench isolation (STI) structure formed by an STI process. A metal-oxide semiconductor (MOS) transistor is then formed in the active area. The MOS transistor comprises a polysilicon gate 101, a gate oxide layer 104 formed under the gate 101, and source/drain regions 106 formed in the silicon substrate 100 on both sides of the gate 101. In addition, spacers 108 are formed on sidewalls of the gate 101.

Figure 1B:
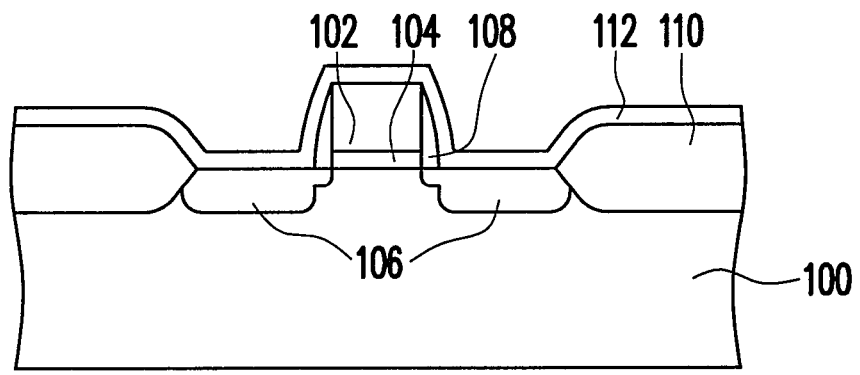

Referring to FIG. 1B, a metal alloy layer 112 is formed over the substrate 100. The metal alloy layer 112 comprises a first refractory metal and a second refractory metal. The first refractory metal or the second refractory metal may be nickel, cobalt, titanium, or platinum, for example. In this embodiment, the first refractory metal is nickel and the second refractory metal is platinum.

Figure 1C:
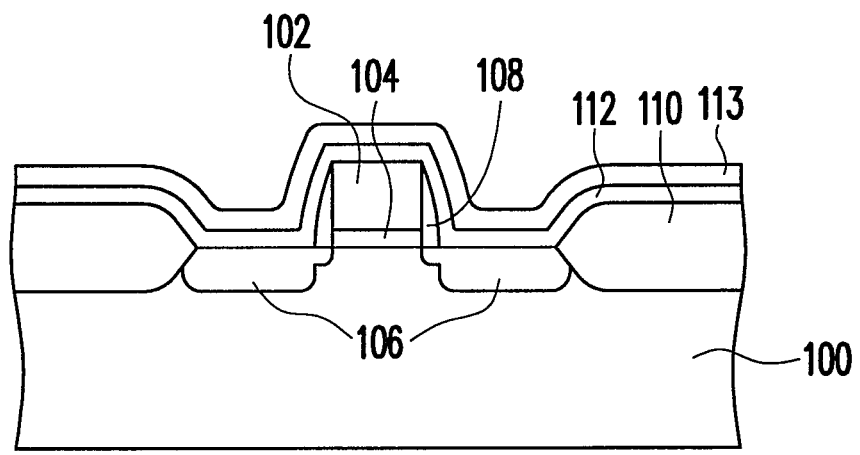

Referring to FIG. 1C, a protection layer 113 is formed over the metal alloy layer 112. The material of the protection layer 113 can be, for example, refractory metal nitride, such as titanium nitride.

Figure 1D:
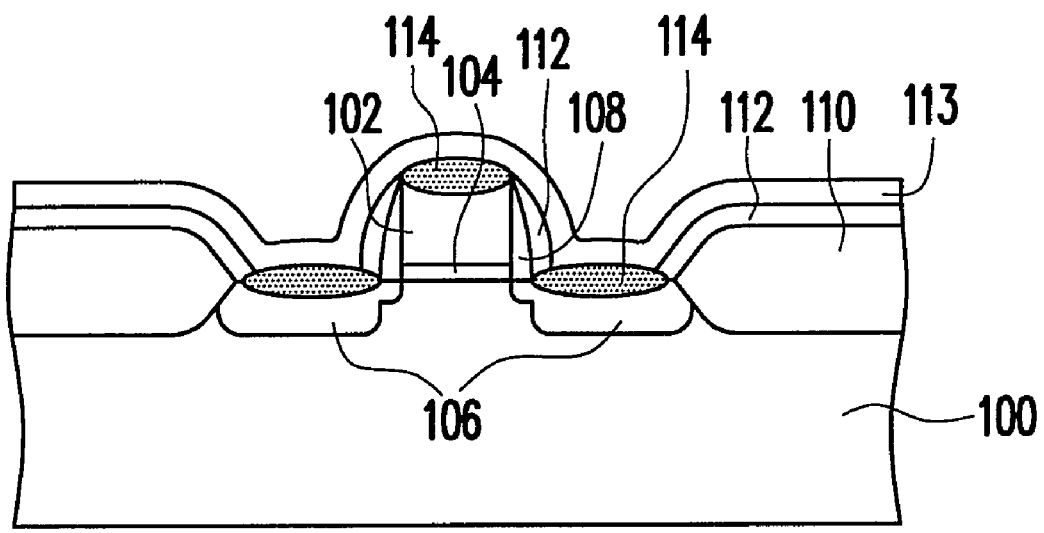

Referring to FIG. 1D, a thermal annealing process is performed so that the metal alloy layer 112 reacts with silicon in the polysilicon gate 101 and the source/drain regions 106 to form a metal (alloy) silicide layer 114 in the self-aligned way. The thermal process can be, for example, a rapid thermal process (RTP).

Figure 1E:
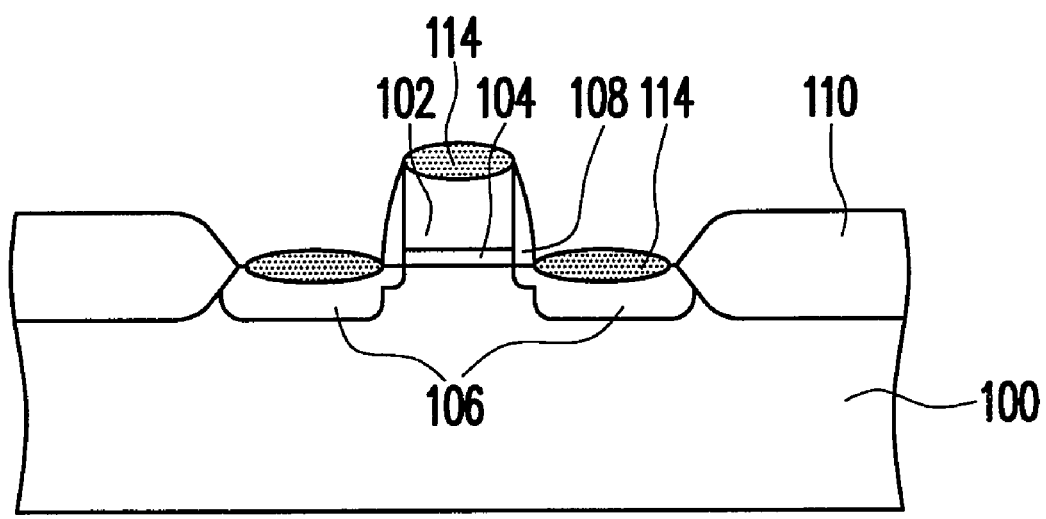

Referring to FIG. 1E, a stripping process using a cleaning solution is performed to remove the unreacted metal alloy layer 112 and the protection layer 113. The stripping process has good selectivity in removing the unreacted metal alloy layer 112 and the protection layer 113 without damaging the metal silicide layer 114. The cleaning solution of the stripping process consists of a mixture of a sulfuric acid solution and a diluted hydrogen peroxide solution. For example, the sulfuric acid solution can be a 96% wt. $H_2SO_4$ solution and the diluted hydrogen peroxide solution can be a 35% wt. $H_2O_2$ solution. As described herein, the weight percentage of sulfuric acid or hydrogen peroxide in the sulfuric acid solution or diluted hydrogen peroxide solution is merely based on the concentrations of commercially available products used in the industry, but the scope of this invention will not be limited by these descriptions.

According to this invention, it is found that adjusting the ratio of sulfuric acid in the mixed solution of sulfuric acid and hydrogen peroxide can increase the reaction temperature and enhance stripping efficiency, leading to complete removal of unreacted or remained refractory metal, such as platinum.

Figure 4:
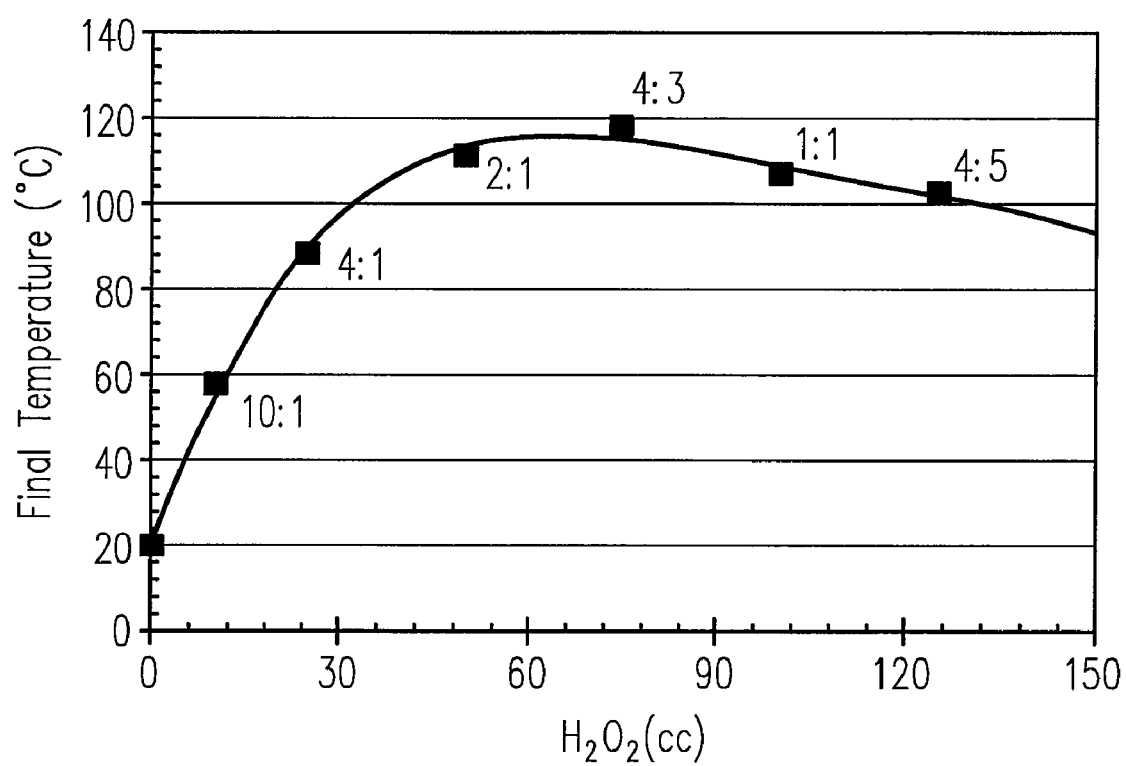
FIG. 4 illustrate the relation of the final reaction temperature versus the mixing ratio of $H_2SO_4$ solution/$H_2O_2$ solution.

FIG. 4 illustrate the relation of the final reaction temperature versus the mixing ratio of $H_2SO_4$ solution/$H_2O_2$ solution. Based on FIG. 4, it is shown that an appropriate range (from about the ratio of 3:1 $H_2SO_4$ solution:$H_2O_2$ solution to the ratio of 4:5 $H_2SO_4$ solution:$H_2O_2$ solution) can be obtained by adjusting the ratio of $H_2SO_4$ solution in the mixture to promote exothermic reaction of sulfuric acid. Moreover, a climax or peak (from about the ratio of 2:1 $H_2SO_4$ solution:$H_2O_2$ solution to the ratio of 4:3 $H_2SO_4$ solution:$H_2O_2$ solution) can be reached by adjusting the ratio of $H_2SO_4$ solution in the mixture. As a general rule, it is desirable to increase the final reaction temperature (the reaction temperature of the cleaning solution on the wafer surface) to be equal to or higher than 100° C., for efficient stripping effects and complete removal of residual metal. According to FIG. 4, the appropriate range, sufficiently for reaching final reaction temperature equal to or higher than 100° C., for the mixing ratio of $H_2SO_4$ solution/$H_2O_2$ solution should be between about 3:1 and 4:5. More specifically, adjusting the mixing ratio of $H_2SO_4$ solution/$H_2O_2$ solution to the peak range (about 2:1 to 4:3) may reach even higher final reaction temperature, thus increasing the removal effectiveness of the residual platinum.

In one preferred embodiment, the cleaning solution is a mixture of a sulfuric acid solution and a diluted hydrogen peroxide solution with the ratio of the sulfuric acid solution and diluted hydrogen peroxide solution ranging from approximately 3/1 to 4/5, preferably, from approximately 2/1 to 4/3. For clarification, the ratio 3/1 of the sulfuric acid solution/diluted hydrogen peroxide solution for the cleaning solution is defined as the mixing ratio of 3 parts $H_2SO_4$ solution/1 part diluted $H_2O_2$ solution. By using the cleaning solution with the mixing ratio of $H_2SO_4$ solution/$H_2O_2$ solution in the appropriate range (about 3/1 to 4/5), it is possible to efficiently remove the remained unreacted platinum or nickel-platinum alloy in one single stripping process, without using additional cleaning solutions or performing another stripping process.

Additionally, de-ionized water can be supplemental co-applied with the cleaning solution during the stripping process for promoting the exothermic reaction of sulfuric acid and increasing the final reaction temperature on the wafer surface. Basically, it is advantageous to co-apply water when the cleaning solution has the mixing ratio of $H_2SO_4$ solution/$H_2O_2$ solution larger than 1/1. For reaching higher reaction temperature, the content of sulfuric acid has to be larger so that water can react with sulfuric acid for the exothermic reaction. However, it may not be helpful, if water is co-applied with the cleaning solution of $H_2SO_4$ solution/$H_2O_2$ solution in the peak range (about 2:1 to 4:3), as the climax reaction temperature has been reached. That is, the addition of water during the stripping process can be considered for the process using the cleaning solution with the mixing ratio of $H_2SO_4$ solution/$H_2O_2$ solution larger than 1/1 but smaller than 4/3, for example.

Figure 3A:
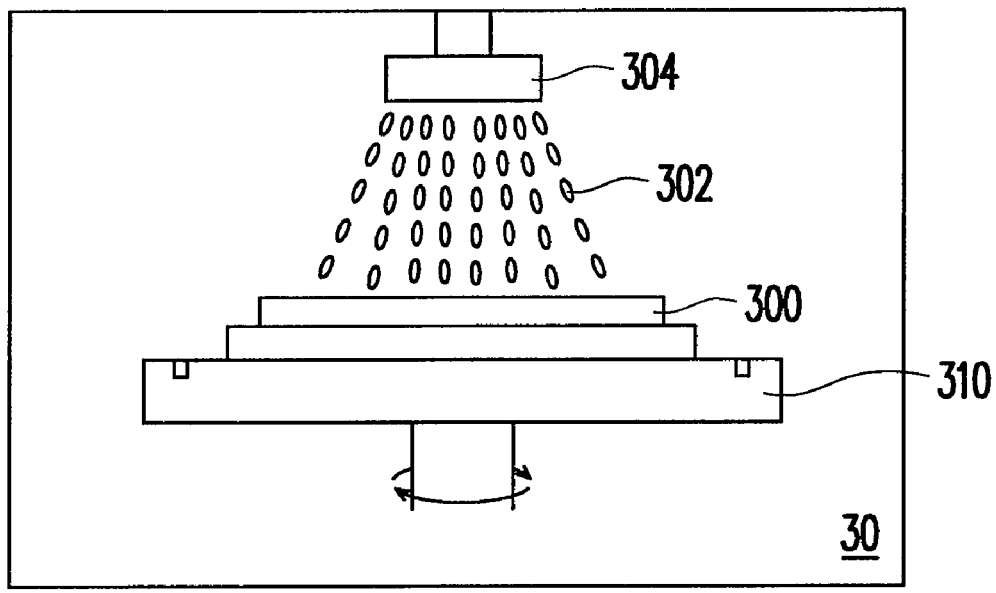
Figure 3B:
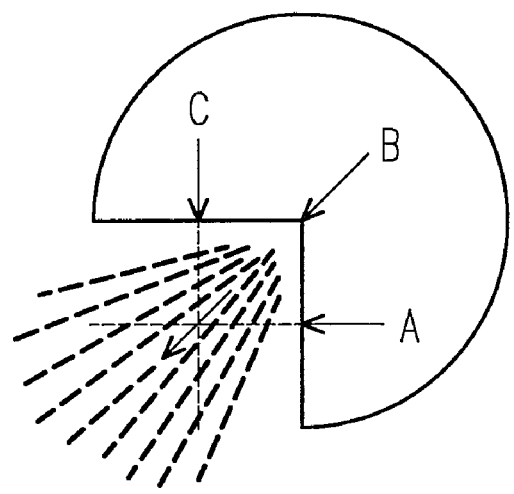
FIG. 3B is a schematic bottom view showing the design of the nozzle in the chamber.

FIG. 3A is a schematic side view of the etch chamber for the stripping process, while FIG. 3B is a schematic bottom view showing the design of the nozzle in the chamber. For the stripping process, wafer 300 is placed on the rotating platen 310 within the etch chamber 30 and the cleaning solution 302 is sprayed from the nozzle 304 to the wafer surface for selectively removing the unreacted residual metal. During the stripping process, water can be added to promote the exothermic reaction of the cleaning solution. In practice, water is not added to the cleaning solution directly but co-applied with the cleaning solution through the same nozzle. Referring to FIG. 3B, the nozzle 304 can be designed to include three parts A, B and C for respectively dispensing (or spraying) the cleaning solution (pre-mixed), nitrogen gas and de-ionized water. Nitrogen gas (or other carrier gas) may be used for purging out the cleaning solution and water for parts A, C. The nitrogen gas from part B promotes mist effects for the liquids to achieve uniform distribution of the cleaning solution and water. The water sprayed from part C not only helps raised the reaction temperature on the wafer surface but also assists uniform distribution of the cleaning solution.

Note that the method of the present invention can be applicable to other silicon-containing structures, and the scope of the present invention will not be limited by the above-mentioned MOS transistor described herein.

Figure 2:
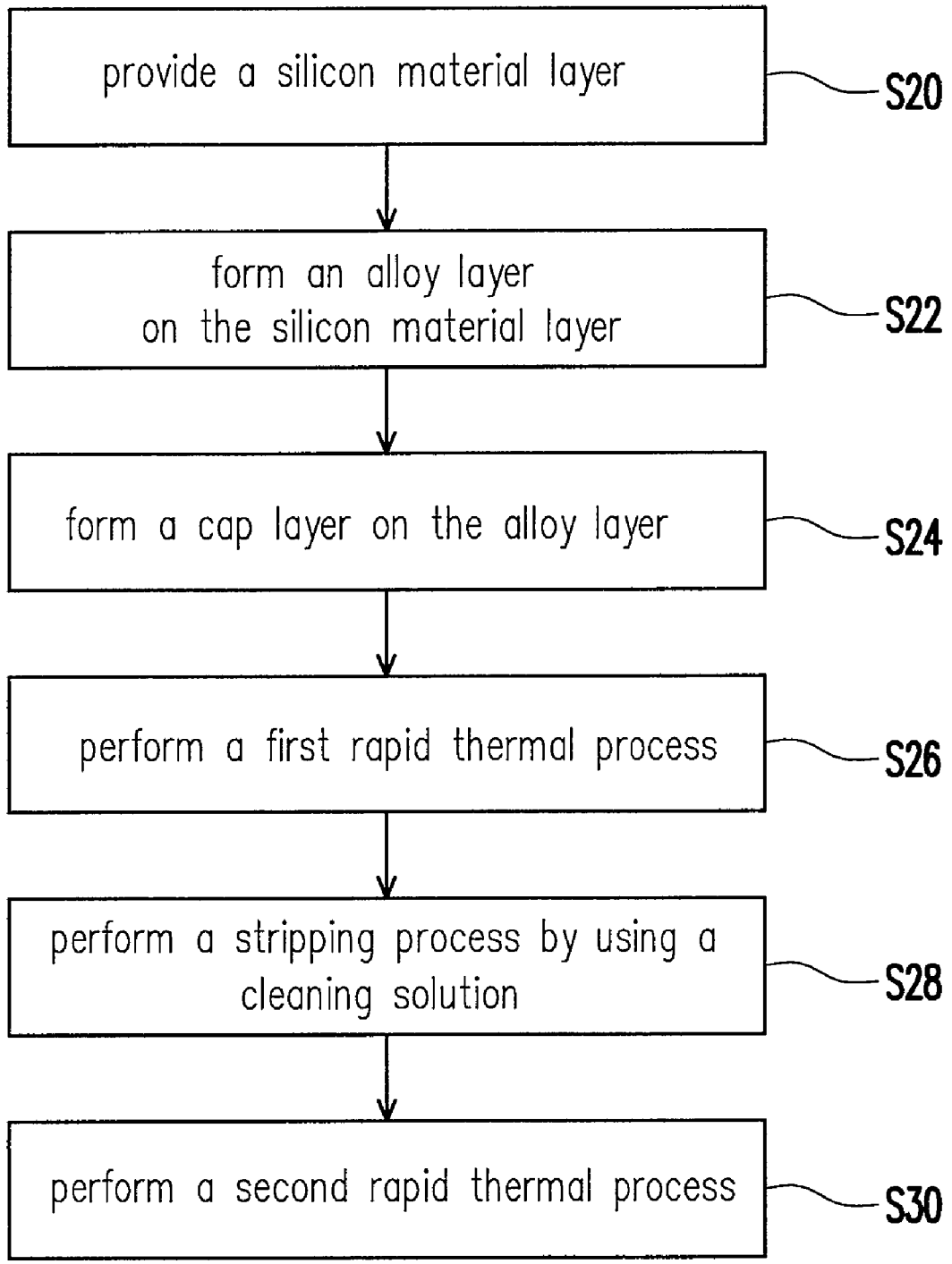
FIG. 2 is a flow chart of the method for fabricating a metal silicide layer according to another embodiment of the present invention.

FIG. 2 is a flow chart of the method for fabricating a metal silicide layer according to another embodiment of the present invention.

First, step S20 is performed, in which a silicon material layer is provided. For example, the silicon material layer may be the polysilicon layer of the gate electrode or the silicon substrate of the source/drain regions.

Next, step S22 is performed, in which a metal alloy layer is formed on the silicon material layer. The metal alloy layer can be made of a nickel-platinum alloy, for example. The metal alloy layer can be formed by physical vapor deposition, e.g. sputtering, for example.

Next, step S24 can be optionally performed, where a cap layer is formed on the metal alloy layer to prevent oxidation of the formed alloy layer due to the exposure to air. The material of the cap layer is, for example, TiN.

Then, step S26 is performed, in which a first rapid thermal process is performed, so that silicon in the silicon material layer reacts with the metal alloy layer to form a metal silicide layer. The temperature of the first rapid thermal process is 200° C. to 500° C., and the heating method of the rapid thermal process can be single or two-stage heating, for example.

Next, step S28 is performed, in which a stripping process is performed by using a cleaning solution to remove the cap layer and the metal alloy layer that is not fully reacted. The cleaning solution used in the stripping process is, for example, a mixture of a sulfuric acid solution and a diluted hydrogen peroxide solution with the ratio of the sulfuric acid solution and diluted hydrogen peroxide solution ranging from approximately 3/1 to 4/5. Optionally, step S30 may be performed after step S28, in which a second rapid thermal process is performed, so that metal silicide in the metal alloy layer may become more stable. The temperature of the second rapid thermal process is 350° C. to 500° C., for example.

The stripping process can be a single or two-staged process depending on whether de-ionized water is added during the stripping process. Taking the two-staged process as an example, the first stage is performed using only cleaning solution, while the second stage is performed by spraying both of the cleaning solution and water. For example, the first stage of the stripping process is performed for about 50-200 seconds using the afore-mentioned cleaning solution under a lower rotation speed of the platen of about 30-200 rpm, while the second stage of the stripping process is performed for about 5-40 seconds using de-ionized water and the afore-mentioned cleaning solution under a higher rotation speed of the platen of about 200-600 rpm. Through considering the rotation speed of the platen, water used in the second stage can further help removing the residual particles or by-products by mechanical forces. Besides, these two stages may be performed repeatedly or in cycles until the desired cleaning effects are reached. Depending on the process requirements, other factors relating to the mechanical behaviors of the platen, including the rotation speed, forward or backward rotation, can be adjusted or fine-tuned and should be incorporated into the scope of this invention.

The method for fabricating a metal silicide provided by the present invention uses a cleaning solution with the specific ratio of sulfuric acid, so that the residual platinum can be effectively removed without damaging the metal silicide. Thus, a high-quality metal silicide can be fabricated.

Moreover, during the stripping process of the method, water may be further added to enhance the removal efficiency of the residual metals by increasing the reaction temperature on the wafer surface.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A method for fabricating a metal silicide layer, comprising:
providing a silicon material layer;
forming a metal alloy layer on the silicon material layer, wherein the metal alloy layer contains platinum and nickel;
performing a first rapid thermal process (RTP) so as to form a metal alloy silicide layer through reaction of silicon in the silicon material layer with the metal alloy layer; and
performing a first etching process on a rotation platen by using a cleaning solution at a lower rotation speed to remove the metal alloy layer that is not fully reacted, wherein the cleaning solution is a mixture of a sulfuric acid solution and a diluted hydrogen peroxide solution, and
performing a second etching process on the rotation platen at a higher rotation speed to further remove the metal alloy layer that is not fully reacted, wherein water is co-applied with the cleaning solution in the second etching process when a mixing ratio of the sulfuric acid solution to the diluted hydrogen peroxide solution is larger than 1/1.

2. The method as claimed in claim 1, wherein the sulfuric acid solution includes at least 96% wt. sulfuric acid and the diluted hydrogen peroxide solution includes at least 35% wt. hydrogen peroxide.

3. The method as claimed in claim 2, wherein water is co-applied with the cleaning solution during the second etching process when the mixing ratio of the sulfuric acid solution to the diluted hydrogen peroxide solution is larger than 1:1 but smaller than 4:3 or larger than 2:1.

4. The method as claimed in claim 3, wherein the second etching process is applied for one-eleventh to one-sixth of a length of the first etching process and the second etching process.

5. The method as claimed in claim 4, wherein the first etching process is performed using the cleaning solution for about 50-200 seconds at a rotation speed of about 30-200 rpm, and the second etching process is subsequently performed for about 5-40 seconds at the rotation speed of about 200-600 rpm.

6. The method as claimed in claim 3, wherein the temperature of each of the first etching process and the second etching process is 100° C. or higher than 100° C.

7. The method as claimed in claim 3, wherein each of the first etching process and the second etching process comprises a chemical mechanical polishing process.

8. The method as claimed in claim 7, wherein the chemical mechanical polishing process is performed in the first etching process for about 50-200 seconds at a rotation speed of 30-200 rpm, and is performed in the second etching process for 5-40 seconds at a rotation speed of 200-600 rpm.

9. The method as claimed in claim 2, wherein the cleaning solution has the mixing ratio of the sulfuric acid solution:the diluted hydrogen peroxide solution ranging from approximately 2:1 to 4:3.

10. The method as claimed in claim 1, further comprising performing a second rapid thermal process (RTP), wherein a temperature of the first rapid thermal process is lower than that of the second rapid thermal process.

11. The method as claimed in claim 1, further comprising forming a cap layer on the metal alloy layer after the metal alloy layer is formed and before performing the first rapid thermal process.

12. The method as claimed in claim 11, wherein a material of the cap layer is TiN.

13. The method as claimed in claim 1, wherein the metal alloy layer is formed by physical vapor deposition.

14. The method as claimed in claim 1, wherein a material of the silicon material layer is monocrystalline silicon or polysilicon.

* * * * *